US008818612B2

(12) United States Patent
Das (10) Patent No.: US 8,818,612 B2
(45) Date of Patent: Aug. 26, 2014

(54) ON-BOARD DIAGNOSTIC CONNECTOR MODULE AND VEHICLE DIAGNOSTIC SYSTEM

(75) Inventor: Rajesh Das, Canton, MI (US)

(73) Assignee: Robert Bosch GmbH, Stuttgart (DE)

( * ) Notice: Subject to any disclaimer, the term of this patent is extended or adjusted under 35 U.S.C. 154(b) by 425 days.

(21) Appl. No.: 13/232,816

(22) Filed: Sep. 14, 2011

(65) Prior Publication Data
US 2013/0066514 A1 Mar. 14, 2013

(51) Int. Cl.
*G06F 17/00* (2006.01)

(52) U.S. Cl.
USPC ........ 701/31.4; 701/31.5; 701/32.7; 701/33.2

(58) Field of Classification Search
CPC ....... G06F 17/27; G06F 17/30; H05K 5/0026; H05K 5/003; H05K 5/0034; G01M 15/04; G01M 15/042; G01M 14/104; G01M 15/106; G01M 15/108; G01M 15/11; G01M 15/12
USPC ...................... 701/31.4, 31.5, 32.7, 33.2, 33.4
See application file for complete search history.

(56) References Cited

U.S. PATENT DOCUMENTS

| 5,618,186 | A | 4/1997 | Saka et al. |
| 6,350,949 | B1 | 2/2002 | Boyd |
| 7,248,954 | B2 * | 7/2007 | Chinnadurai et al. ....... 701/32.7 |
| 2006/0149434 | A1 | 7/2006 | Bertosa et al. |
| 2006/0217855 | A1 | 9/2006 | Chinnadurai et al. |
| 2007/0156311 | A1 | 7/2007 | Elcock et al. |
| 2008/0079551 | A1 | 4/2008 | Blanchet et al. |
| 2010/0103632 | A1 | 4/2010 | Kato |

FOREIGN PATENT DOCUMENTS

| EP | 1487247 | 12/2004 |
| EP | 2302597 | 3/2011 |
| GB | 2407212 | 4/2005 |

OTHER PUBLICATIONS

International Search Report and Written Opinion for International Appl. No. PCT/IB2012/001769 dated Jan. 28, 2013, 12 pages.

* cited by examiner

*Primary Examiner* — Richard Camby
(74) *Attorney, Agent, or Firm* — Michael Best & Friedrich LLP (57) ABSTRACT

A diagnostic connector module for a vehicle includes an electronic communication module and a housing enclosing the electronic communication module. The housing has integrated connectors electrically connected to the electronic communication module. The integrated connectors include a diagnostic service connector for connection with an external diagnostic scan tool and a vehicle bus connector connectable to a vehicle bus. The diagnostic service connector has a plurality of female pin-receptors electrically connected to the electronic communication module, and the vehicle bus connector has a plurality of terminals electrically connected to the electronic communication module. A vehicle diagnostic system including the diagnostic connector module is also provided.

15 Claims, 6 Drawing Sheets

ON-BOARD DIAGNOSTIC CONNECTOR MODULE AND VEHICLE DIAGNOSTIC SYSTEM

BACKGROUND

The present invention relates to a data link connector (DLC), or on-board diagnostics port ("OBD port"), in a motor vehicle. Since 1996, DLCs for U.S. automobiles have been standardized (e.g., for connector type and communication protocol) according to the "OBD-II" standard. This enables a vehicle owner or service professional to plug a scan tool into the vehicle's OBD-II port and retrieve information relating to fault codes stored in the vehicle's engine control unit (ECU), which monitors various sensors and controls engine operation via fuel metering and/or throttle control. Although the U.S. government mandates that the OBD-II port provide access to information relating to emissions subsystems of the vehicle (i.e., catalytic converter(s), exhaust gas sensor(s), etc.), OBD-II ports are typically enabled by auto manufacturers to allow access to parameters and fault codes related to many additional vehicle subsystems.

OBD-II ports, which are typically mounted at the lower portion of the instrument panel near the steering wheel, are 16-pin female connectors connected to the vehicle's ECU by a wire harness. The wire harness contains a set of wires, each of which runs from one of the female pin receptors of the OBD-II port to the ECU. When a scan tool is plugged into the OBD-II port via a cable with a complementary plug, the scan tool communicates directly with the ECU for fault code retrieval and parameter checking and resetting.

SUMMARY

In one aspect, the invention provides a diagnostic connector module for a vehicle. The module includes an electronic communication module and a housing enclosing the electronic communication module. The housing has integrated connectors electrically connected to the electronic communication module. The integrated connectors include a diagnostic service connector for connection with an external diagnostic scan tool and a vehicle bus connector connectable to a vehicle bus. The diagnostic service connector has a plurality of female pin-receptors electrically connected to the electronic communication module, and the vehicle bus connector has a plurality of terminals electrically connected to the electronic communication module.

In another aspect, the invention provides a vehicle diagnostic system including an electronic control unit configured to monitor at least one vehicle system for one or more fault conditions and to generate one or more corresponding fault codes. A vehicle bus couples a vehicle bus plug connector with the electronic control unit to enable the communication of electrical signals between the electronic control unit and the vehicle bus plug connector. A diagnostic connector module of the vehicle diagnostic system includes a diagnostic service connector for establishing connection with an external diagnostic scan tool, an electronic communication module electrically coupled with the diagnostic service connector, a housing enclosing the electronic communication module, and an integrated vehicle bus connector having a plurality of terminals electrically connected to the electronic communication module. The plurality of terminals are configured for making a plug-type connection with the vehicle bus plug connector. The electronic communication module of the diagnostic connector module is configured to transfer the one or more fault codes from the electronic control unit to an external diagnostic scan tool via the diagnostic service connector of the diagnostic connector module.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
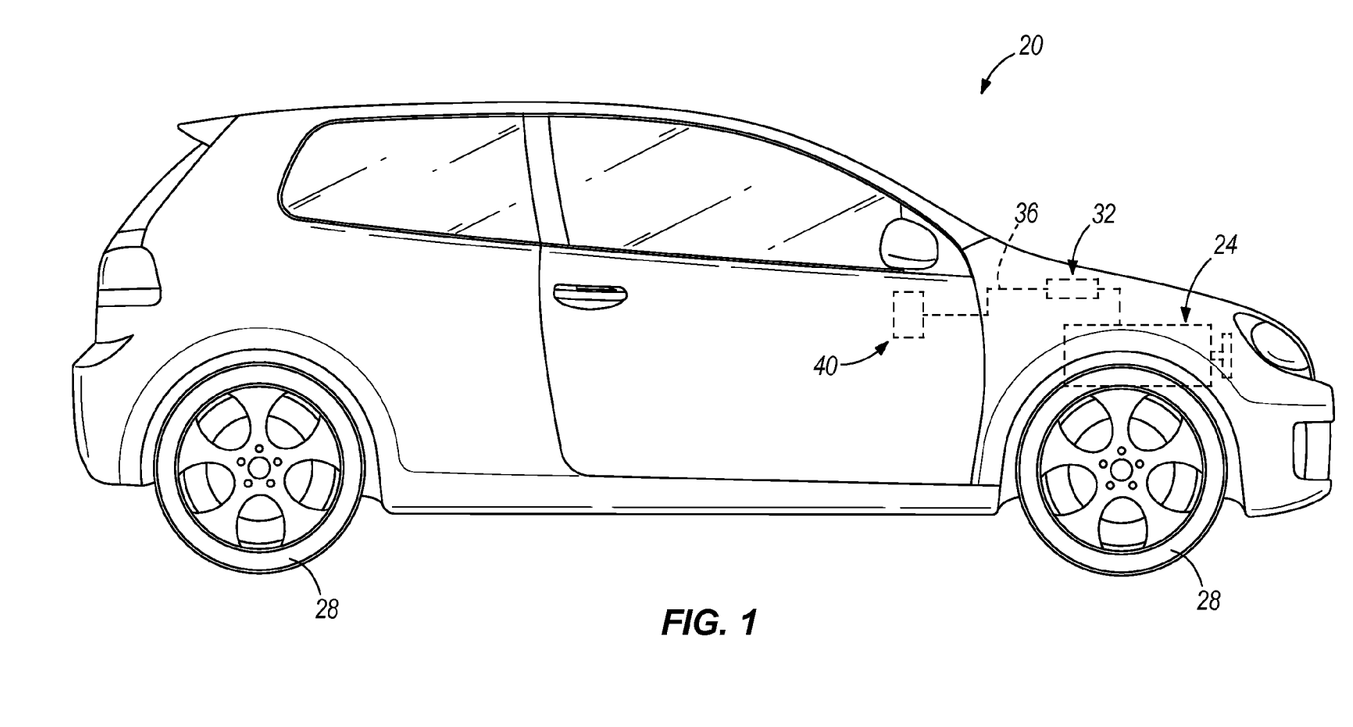
FIG. 1 is a schematic view of a vehicle having an engine control unit and a diagnostic connector module.

FIG. 1 illustrates a vehicle 20 having an engine 24 operable to rotate one or more wheels 28 to move the vehicle 20. In some constructions, the engine 24 is a fuel-burning internal combustion engine 24, but the engine 24 may be an alternate type of power source (e.g., an electric motor or combined fuel-burning and electric hybrid power source). An engine control unit (ECU) 32 controls the output of the engine 24 in response to inputs from driver controls. For example, the ECU 32 may control at least one of throttle opening angle, fuel injection amount, ignition timing, intake valve lift and timing, exhaust valve lift and timing, and boost pressure of an internal combustion engine to control the power output. The ECU 32 communicates with a scan tool (not shown) via a vehicle communication bus 36 and a diagnostic connector module 40 as shown in FIG. 1. Although not necessarily required, the ECU 32 may be positioned adjacent the engine 24 under the hood of the vehicle 20, and the diagnostic connector module 40 may be positioned in an interior of the vehicle 20. It should also be noted that the ECU 32 may refer generally to an electronic control unit that manages or controls any number of vehicle systems, which may include an internal combustion engine, an alternative non-combustion power source, or a combination thereof, and monitors such vehicle systems for system and/or component status, including fault conditions.

Figure 2:
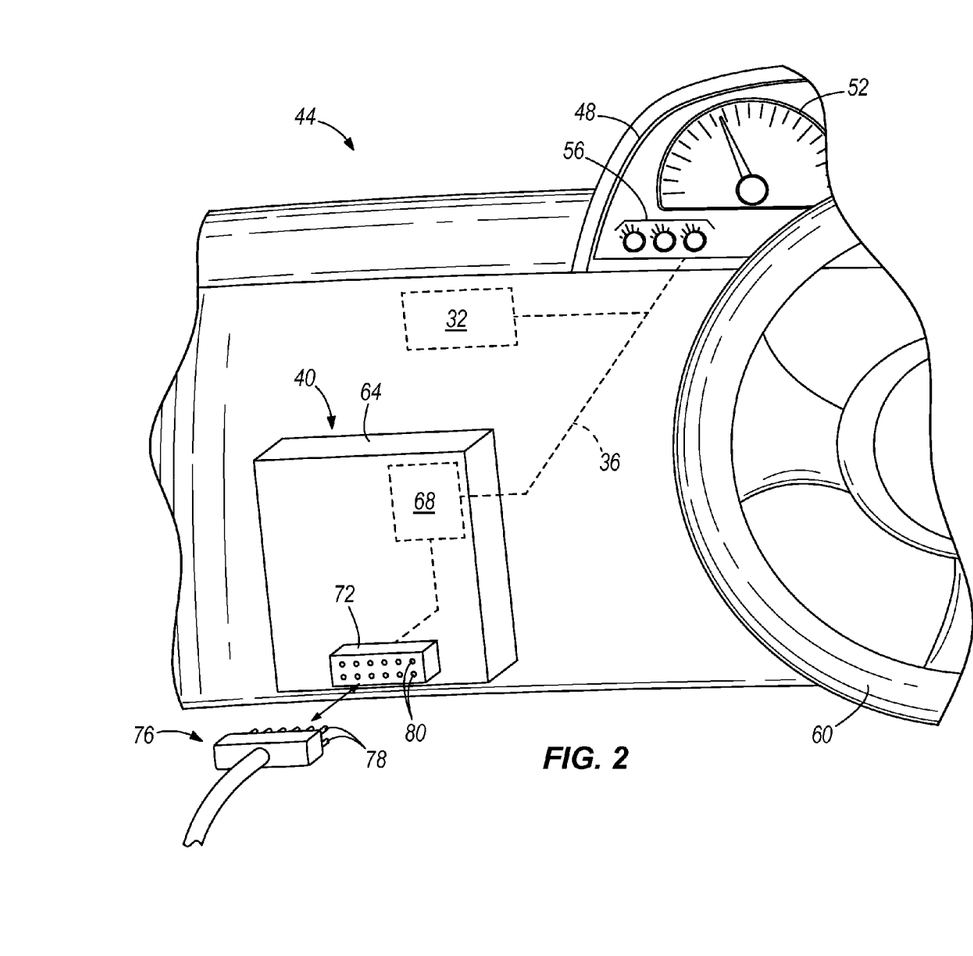
FIG. 2 is a perspective view of an instrument panel of the vehicle of FIG. 1, schematically illustrating the diagnostic connector module and the engine control unit.

FIG. 2 shows a basic arrangement of the diagnostic connector module 40 inside the vehicle 20 as part of a vehicle diagnostic system. It should be noted that the diagnostic connector module 40 is represented in a fundamental or basic form merely for the purpose of illustrating how the diagnostic connector module 40 is integrated into the vehicle 20, and specific aspects of the physical structure of the diagnostic connector module 40 are shown in FIGS. 3-6 and described in further detail below. The diagnostic connector module 40 is positioned on a dashboard 44 of the vehicle 20. The dashboard 44 includes a gauge pod or instrument panel 48 having at least one gauge 52 (e.g., speedometer, tachometer, fuel level, coolant temperature, oil pressure, battery charge level, etc.) and at least one warning light 56. A steering wheel 60 projects outwardly from the dashboard 44 into the cabin of the vehicle 20 for providing directional control of the vehicle 20 in a known manner. The diagnostic connector module 40 can be positioned to the side of the steering wheel 60 at a lower portion of the dashboard 44 as illustrated. However, the diagnostic connector module 40 may alternately be positioned at another location in or on the dashboard 44, at another location inside the vehicle cabin, or at another location remote from the vehicle cabin (e.g., in the engine compartment). The diagnostic connector module 40 includes a housing 64 and an electronic communication module 68 positioned inside the housing 64 such that the housing 64 encloses the electronic communication module 68. The electronic communication module 68 is coupled for electronic communication with the instrument panel 48 and the ECU 32 via the vehicle communication bus 36. The electronic communication module 68 is also coupled to a diagnostic port or connector 72 provided on the front (i.e., a surface facing outwardly from the dashboard 44 or other mounting surface) of the diagnostic connector module 40. The electronic communication module 68 provides a communication gateway between the diagnostic connector 72, the ECU 32, and various vehicle subsystems and/or components whose conditions can be monitored via vehicle busses including the vehicle communication bus 36.

The diagnostic connector 72, which is described in further detail below, can be a diagnostic data link connector such as an OBD-II data link connector used for communication with a diagnostic service tool or "scan tool" via a data link cable 76 (FIG. 2). The electronic connection used for communicating information between the vehicle 20 and the external scan tool is established by inserting conductive pins 78 of the data link cable 76 into corresponding conductive receptacles 80 of the diagnostic connector 72. The array of conductive pins 78 of the data link cable 76 correspond to the array of conductive receptacles 80, and furthermore, the data link cable 76 has a shape that corresponds to and physically mates with a shape of the diagnostic connector 72 of the module 40.

The general arrangement shown in FIG. 2 constitutes a vehicle diagnostic system, which includes the ECU 32, the vehicle bus 36 (which terminates in a plug connector as described in further detail below), the diagnostic connector module 40, and optionally the instrument panel 48 itself, particularly the warning lights 56. The type of information communicated to the external scan tool via the module 40 may include information regarding the status or operation of emissions equipment (or measurement signals therefrom), but other types of information may also be communicated (e.g., diagnostic trouble codes relating to the status of any of the operational devices of the vehicle 20). In some constructions, the vehicle communication bus 36 couples the diagnostic connector module 40 to both the ECU 32 and the instrument panel 48 as shown in FIG. 2. When any diagnostic trouble code is generated by a component of the vehicle 20, the code may be transmitted to the ECU 32, and if the vehicle 20 is configured with a corresponding warning light 56, the ECU 32 provides a signal to the instrument panel 48 to illuminate the warning light 56. The diagnostic trouble code may be stored in the ECU 32 for later access. Any diagnostic trouble codes can be acquired by an external scan tool through the diagnostic connector module 40 from the ECU 32 when the data link cable 76 of the scan tool is coupled with the module 40 (via diagnostic connector 72). The electronic communication module 68, which may include a microcontroller, enables and/or directs the transfer of information (e.g., system states or fault codes) about the various vehicle systems and/or components between the external scan tool and the ECU 32.

The diagnostic connector module 40 is illustrated in greater detail in FIGS. 3-6. The housing 64 includes a first housing member 64A and a second housing member 64B. In the illustrated construction, the first housing member 64A is a front housing member that is configured to face outwardly from the dashboard 44 or other mounting surface, and the second housing member 64B is a rear housing member that is configured to face the dashboard 44 or other mounting surface. The diagnostic connector 72 is unitarily formed (e.g., integrally molded as a single piece) with the first housing member 64A. To each side of the diagnostic connector 72, the first housing member 64A includes a mounting flange 84, 85. The mounting flanges 84, 85 protrude from a front surface 88 of the first housing member 64A and include respective mounting apertures 84A, 85A (e.g., for receiving mounting bolts). In the illustrated construction, the mounting aperture 84A of the first mounting flange 84 is substantially circular in shape, and the mounting aperture 85A of the second mounting flange 85 is substantially elongated or oval-shaped. In addition to extending outwardly from the front surface 88, the mounting flanges 84, 85 extend in a width-wise direction away from each other to define a maximum width $W_{max}$ of the housing 64, which is also a maximum width of the diagnostic connector module 40 as a whole.

Figure 3:
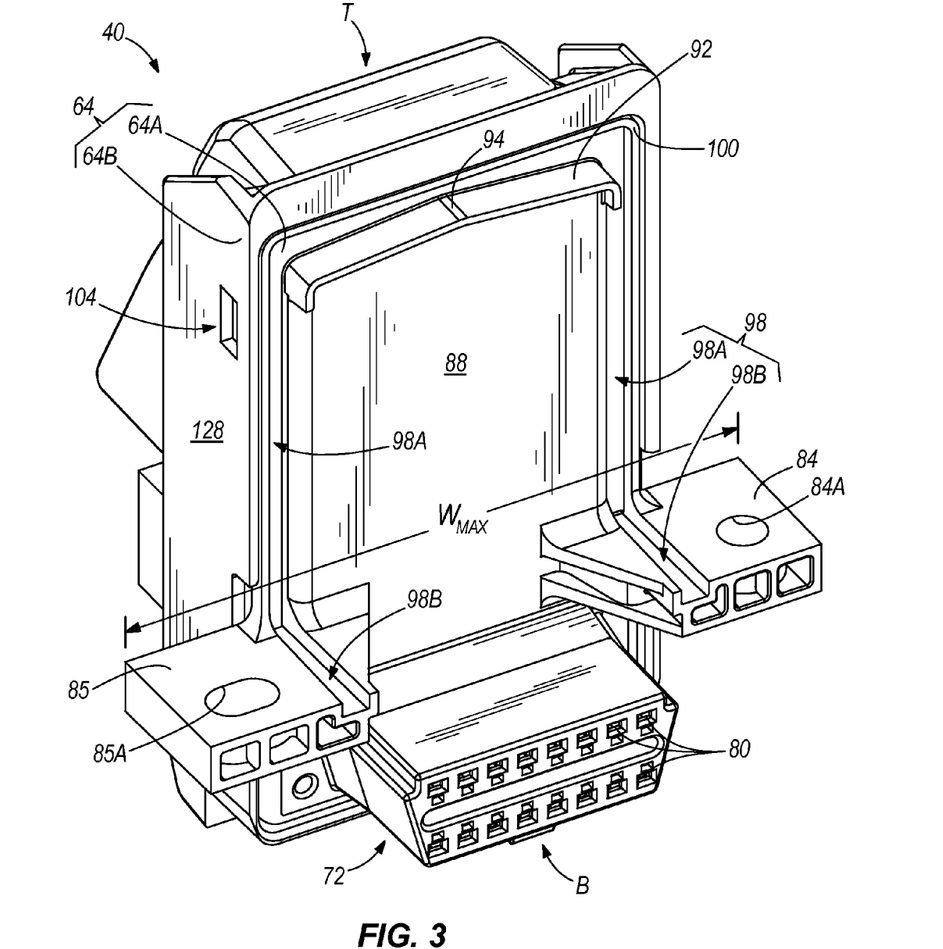
FIG. 3 is a perspective view of a front side of the diagnostic connector module of FIGS. 1 and 2.
Figure 4:
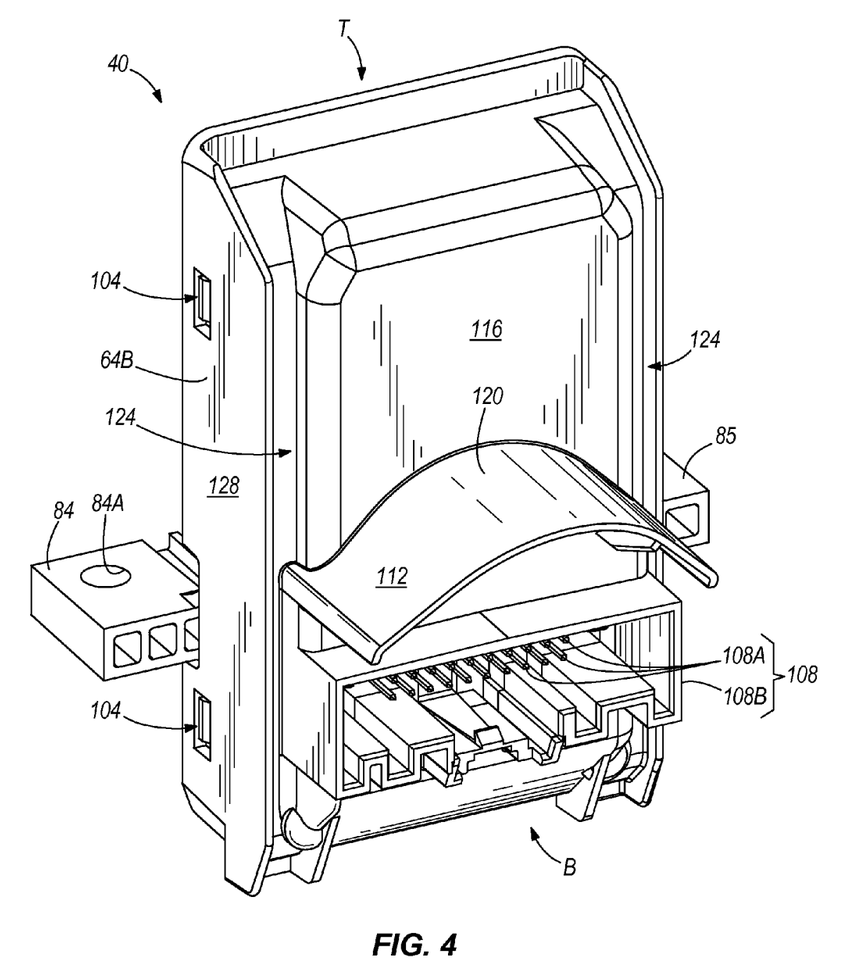
FIG. 4 is a perspective view of a rear side of the diagnostic connector module of FIGS. 1 and 2.

In the illustrated construction, the diagnostic connector module 40 has designated top and bottom ends indicated by the reference letters T and B in FIGS. 3 and 4. Although not necessarily required, the diagnostic connector 72 is positioned adjacent the bottom end B, and the mounting flanges 84, 85 are positioned adjacent the diagnostic connector 72, just slightly further from the bottom end B. In conjunction with the diagnostic connector module 40 having a prescribed vertical orientation, water control features are provided in the first housing member 64A as shown in FIG. 3. A hood 92 is positioned at a position that is further toward the top end T than the diagnostic connector 72 (e.g., adjacent the top end T). The hood 92 can be a projecting wall extending outwardly from the front surface 88 of the first housing member 64A. In the illustrated construction, the hood 92 extends outwardly from the front surface 88 of the first housing member 64A to be substantially normal to the front surface 88. Furthermore, the hood 92 includes a central vertex 94 from which the two sides of the hood 92 are pitched toward the bottom end B. A channel 98 is formed in the first housing member 64A alongside each end of the hood 92. Each channel 98 includes a substantially vertically-extending first portion 98A and a substantially horizontally-extending second portion 98B. The first channel portion 98A is substantially parallel to and recessed from the front surface 88 adjacent a peripheral side wall 100 of the first housing member 64A, and the second channel portion 98B extends from the lower end of the first channel portion 98A substantially perpendicularly outward away from the front face 88 and through the respective mounting flanges 84, 85. Therefore, substantially all water dripping from above the diagnostic connector module 40 on the side of the first housing member 64A toward the diagnostic connector 72 will contact the hood 92 and run off the hood 92 into the channels 98 due to the pitch of the hood 92. By being collected in the channels 98, water is prevented from infiltrating into the diagnostic connector 72 where it can potentially foul the electrical connection. To promote water draining out of the second channel portions 98B, the second channel portions 98B may be pitched slightly downwardly, either by being configured at an angle slightly greater than 90 degrees with the first channel portions 98A or by an overall tilt of the diagnostic connector module 40 present when the module 40 is assembled to the dashboard 44 or other mounting surface.

As shown in FIGS. 3-6, the second housing member 64B snaps together with the first housing portion 64A via a plurality of corresponding mating snap features 104A, 104B, which may include corresponding male and female structures configured to elastically deform during joining to establish firm connecting joints 104 between the two housing members 64A, 64B. An instrument panel connector 108 is unitarily formed (e.g., integrally molded as a single piece) with the second housing member 64B. Although not necessarily required, the instrument panel connector 108 is positioned adjacent the bottom end B of the module 40. Because the diagnostic connector module 40 has a prescribed vertical orientation as described above, water control features are also provided in the second housing member 64B as shown in FIG. 4. A hood 112 is positioned at a position that is further toward the top end T than the instrument panel connector 108 (e.g., substantially half way between the top and bottom ends T, B). The hood 112 can be a projecting wall extending outwardly from a rear surface 116 of the second housing member 64B (i.e., the surface facing opposite the front surface 88 of the first housing member 64A). In the illustrated construction, the hood 112 extends outwardly from the rear surface 116 of the second housing member 64B to be substantially normal to the rear surface 116. Furthermore, the hood 112 is generally convex on its upper side such that a central portion 120 of the hood 112 is closest to the top end T, and the two sides of the hood 112 extend toward the bottom end B when moving along the hood 112 away from the central portion 120. A channel 124 is formed in the second housing member 64B alongside each end of the hood 112. Each channel 124 is substantially vertically-extending adjacent the respective sides of the module 40. The channels 124 are substantially parallel to and recessed from the rear surface 116 adjacent a pair of side walls 128 of the second housing member 64B. The channels 124 are open adjacent the top end T. Therefore, substantially all water dripping from above the diagnostic connector module 40 on the side of the second housing member 64B is either received directly into the channels or contacts the hood 112 and runs off the hood 112 toward the channels 124 due to the downward curvature of the hood 112. By being collected in the channels 124, water is prevented from infiltrating into the instrument panel connector 108 where it can potentially foul the electrical connection. To promote water freely draining out of the channels 124, the channels 124 are also open adjacent the bottom end B.

Figure 5:
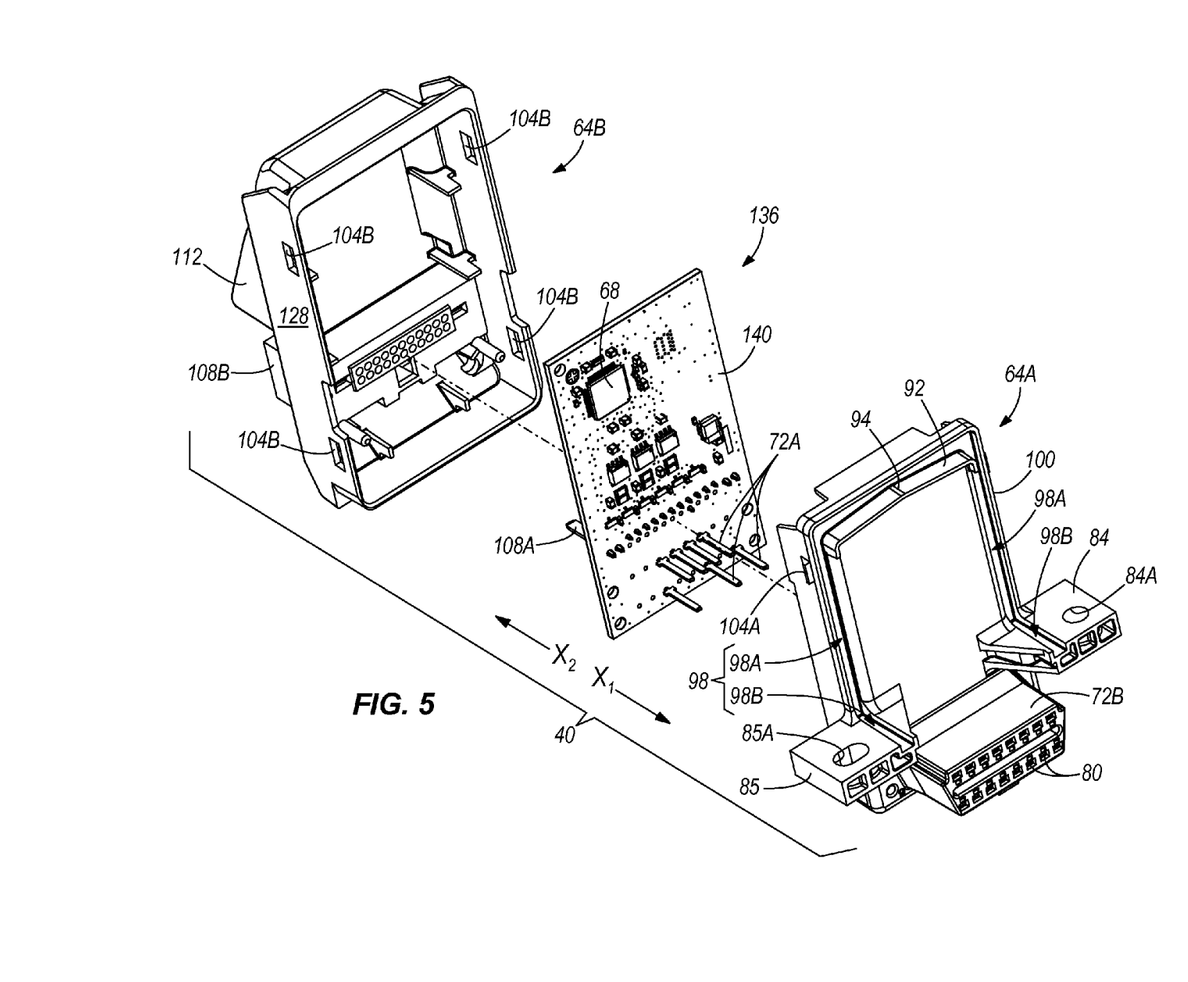
FIG. 5 is an exploded assembly view of the diagnostic connector module from the front side.
Figure 6:
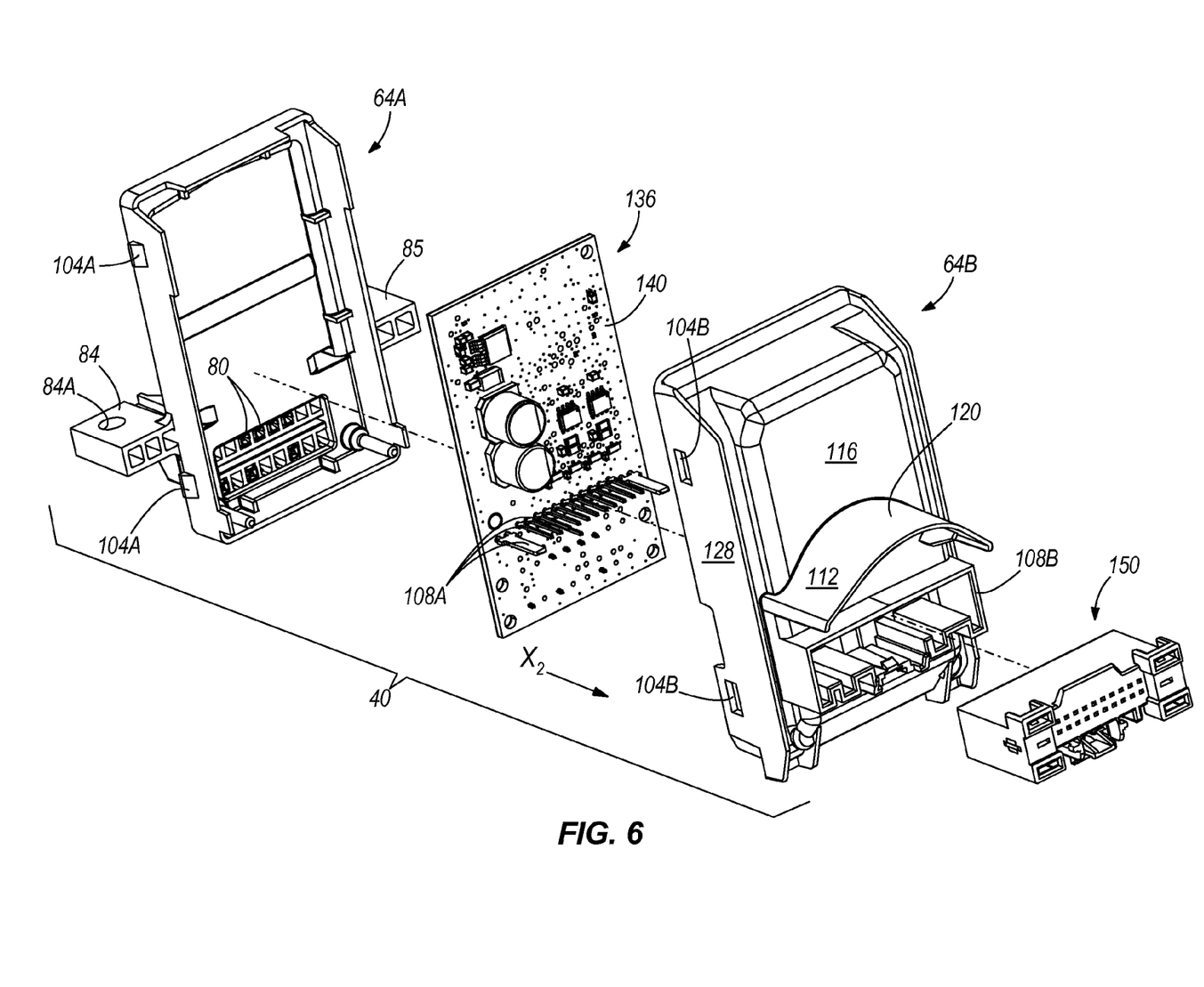
FIG. 6 is an exploded assembly view of the diagnostic connector module from the rear side.

FIGS. 5 and 6 illustrate a printed circuit board (PCB) 136 positioned inside the housing 64. The PCB 136 includes a substrate panel 140 on which electrically-conductive traces are printed and on which the electronic communication module 68 is mounted. Additional surface-mounted devices of the PCB 136 are also mounted on the substrate panel 140 and electrically connected to one or more of the other surface-mounted devices and the electronic communication module 68. In some constructions, the electronic communication module 68 includes a microcontroller having an internal memory. Means are provided on the PCB 136 for establishing electronic communication through the electronic communication module 68 between external devices, such as diagnostic scan tools or programming tools, and both the vehicle communication bus 36 and the ECU 32. In the illustrated construction, electrically-conductive terminal pins (male terminals) are provided on both sides of the PCB 136. A first set of terminals 72A project from the substrate panel 140, substantially perpendicularly thereto, in a first direction $X_1$ toward the first housing member 64A. The first set of terminals 72A are inserted into individual ones of the receptacles 80 (e.g., female-female box terminals) to present a plurality of female pin-receptors that receive the pins 78 of the data link cable 76 and provide one or more electrically-conductive paths between the pins 78 and the electronic communication module 68 of the PCB 136. Thus, the diagnostic connector 72 of the illustrated construction is constituted by the combination of at least the first set of terminals 72A and a shaped connector body 72B, or "connector shroud", of the first housing member 64A (e.g., an integrally-molded portion of the first housing member 64A). In the illustrated construction, the female-female box terminals 80 inside the shaped connector body 72B also contribute to defining the diagnostic connector 72. The female-female box terminals 80 can have at least one of orientation-control and positive retention or "locking" features for either one or both of the first set of terminals 72A and the pins 78 of the data link cable 76. In some constructions, the female-female box terminals 80 are unidirectional and sized to receive male terminals (i.e., the pins 78 and the first set of PCB terminals 72A) of different sizes. The data link cable 76 can have a shape that physically mates with the shaped connector body 72B of the first housing member 64A. The shaped connector body 72B may be configured to provide a friction fit with the data link cable 76 (or alternately, a positive locking fit such as a snap fit) to ensure that the electrical connection is not inadvertently lost.

Likewise, a second set of male terminals 108A project from the substrate panel 140, substantially perpendicularly thereto, in a second direction $X_2$ toward the second housing member 64B. The second set of terminals 108A project through the second housing member 64B to provide an electrically-conductive path between the electronic communication module 68 of the PCB 136 and at least one of the instrument panel 48 and the ECU 32. Thus, the instrument panel connector 108 of the illustrated construction is constituted by the combination of the second set of terminals 108A and a shaped connector body 108B, or "connector shroud", of the second housing member 64B (e.g., an integrally-molded portion of the second housing member 64B). For example in the illustrated construction, the second set of terminals 108A are received into a female plug connector 150 (FIG. 6) of a wire harness that is coupled to the vehicle bus 36. The female plug connector 150 can have a shape that physically mates with the shaped connector body 108B of the second housing member 64B. The female plug connector 150 may snap together with the shaped connector body 108B of the instrument panel connector 108 (or alternately, have a friction fit therewith) to ensure that the electrical connection is not inadvertently lost. Furthermore, the connection between the instrument panel connector 108 and the female plug connector 150 provides a quick-connect/disconnect feature between the diagnostic connector module 40 as a whole and the vehicle bus 36. Therefore, the module 40 can simply and quickly be removed from the vehicle 20 and re-installed without any cutting or splicing of wires.

The instrument panel connector 108 can be a controller-area network (CAN) protocol bus connector configured to be coupled to the instrument panel 48 where power/ground and vehicle CAN busses are active. Power from a battery of the vehicle 20 may be conveyed to the PCB 136, and particularly to the electronic communication module 68, via the instrument panel connector 108. The electronic communication module 68 manages or "gateways" the CAN frames (messages), signals (series of bits within a frame), as well as performing signal translations between the different CAN busses in the vehicle 20 as necessary. The electronic communication module 68 is provided as a means to enable communication amongst the very large number of communication-enabled devices within modern vehicles, where bandwidth is limited and all messages cannot be transmitted on the same vehicle bus (i.e., CAN bus) channel. The electronic communication module 68 is configured to route messages, or signals, to and from the appropriate vehicle bus (e.g., CAN bus) channels. The electronic communication module 68 is configured (e.g., programmed) to perform signal translations as necessary (e.g., by varying data rates, combining or exchanging bits among multiple frames to create one or more new messages, rescaling data, reformatting data, and/or providing it on a different channel).

It should be noted that the term "instrument panel connector" for the connector 108 is used for convenience herein to distinguish from other connectors present, but the physical location where the module 40 connects to the vehicle bus is not necessarily limited to an instrument panel, and the connector 108 may be generally referred to as a vehicle bus connector. In some constructions, the diagnostic connector 72 can be constructed according to the OBD-II standard for diagnostic service connectors. Although the diagnostic connector module 40 having the diagnostic connector 72 is useful for conveying information from the vehicle 20 to an external diagnostic tool, the module 40 (via the diagnostic connector 72) may also be configured to allow a vehicle manufacturer, dealership, or owner to communicate information to the vehicle 20. For example, original software loading or later revisions for the ECU 32 may be communicated from an external computer or network to the ECU 32 through the module 40. Furthermore, it should be understood that although the diagnostic connector 72 and the instrument panel connector 108 are oriented to face away from each other at an angle of substantially 180 degrees, alternate orientations can also be provided by the diagnostic connector module 40 (e.g., the connectors 72, 108 can be oriented at a right angle, or can face in the same direction, or can be oriented at any desired skew angle).

Various features and advantages of the invention are set forth in the following claims.

What is claimed is:

1. A diagnostic connector module for a vehicle, the module comprising:
    an electronic communication module mounted on a printed circuit board; and
    a housing enclosing the electronic communication module, the housing having integrated connectors electrically connected to the electronic communication module, the integrated connectors including
        a diagnostic service connector integrally molded as a single piece with a first housing member and forming an on-board diagnostic port of the vehicle for connection with an external diagnostic scan tool via OBD-ll protocol, the diagnostic service connector having a plurality of female pin-receptors electrically connected to the electronic communication module, and
        a vehicle bus connector integrally molded as a single piece with a second housing member, the vehicle bus connector being connectable to a vehicle bus and having a plurality of terminals electrically connected to the electronic communication module,
    wherein the plurality of female pin-receptors for the diagnostic service connector includes a plurality of female-female box terminals coupled to the printed circuit board via male terminals extending from a first side of the printed circuit board, and the plurality of terminals for the vehicle bus connector includes a plurality of male terminals extending from a side of the printed circuit board opposite the first side, and
    wherein each of the first and second housing members includes a hood and a pair of adjacent channels configured to direct water away from the corresponding one of the diagnostic service connector and the vehicle bus connector.

2. The diagnostic connector module of claim 1, wherein the vehicle bus connector is a controller-area network (CAN) protocol bus connector configured to be coupled to a vehicle instrument panel where power/ground and vehicle CAN busses are active.

3. The diagnostic connector module of claim 1, wherein the first and second housing members are provided with a snap-together coupling interface.

4. The diagnostic connector module of claim 1, wherein each of the first and second housing members has an external face facing away from the other of the first and second housing members when connected, and wherein at least one of the first and second housing members includes an integral mounting flange projecting outwardly from the external face thereof.

5. A vehicle diagnostic system comprising:
    an electronic control unit on-board the vehicle and configured to monitor at least one vehicle system for one or more fault conditions and to generate one or more corresponding fault codes;
    a vehicle bus plug connector on-board the vehicle, the vehicle bus plug connector being non-compatible with OBD-ll protocol;
    a vehicle bus extending between and coupling the vehicle bus plug connector with the electronic control unit to enable the communication of electrical signals between the electronic control unit and the vehicle bus plug connector; and
    a removable diagnostic connector module including
        a diagnostic service connector forming an on-board diagnostic port of the vehicle for establishing connection with an external diagnostic scan tool via OBD-ll protocol,
        an electronic communication module electrically coupled with the diagnostic service connector,
        a housing enclosing the electronic communication module, and
        an integrated vehicle bus connector having a plurality of terminals electrically connected to the electronic communication module, the plurality of terminals being configured for making a plug-type connection with the vehicle bus plug connector,
    wherein the electronic communication module of the diagnostic connector module is configured to transfer the one or more fault codes from the electronic control unit to an external diagnostic scan tool via the diagnostic service connector of the diagnostic connector module, and
    wherein the electronic control unit on-board the vehicle is only operable to communicate with the external diagnostic scan tool when the diagnostic connector module is coupled to the vehicle bus plug connector.

6. The vehicle diagnostic system of claim 5, wherein the vehicle bus is a controller-area network (CAN) protocol bus, and wherein the vehicle bus plug connector and the integrated vehicle bus connector of the diagnostic connector module are CAN protocol bus connectors.

7. The vehicle diagnostic system of claim 5, wherein the vehicle bus is further connected to an instrument panel provided on a dashboard of the vehicle and configured to visually indicate the presence of the one or more fault codes.

8. The vehicle diagnostic system of claim 7, wherein the vehicle bus plug connector is provided on the dashboard, and the diagnostic connector module is removably coupled to the dashboard.

9. The vehicle diagnostic system of claim 8, wherein the housing of the diagnostic connector module includes at least one mounting flange having at least one mounting aperture for attachment to the dashboard.

10. The vehicle diagnostic system of claim 5, wherein the housing includes at least one integral hood covering at least one of the diagnostic service connector and the integrated vehicle bus connector.

11. The vehicle diagnostic system of claim 10, wherein the housing includes at least one external drain channel configured to receive water incident on the at least one integral hood and to direct water away from at least one of the diagnostic service connector and the vehicle bus connector.

12. The vehicle diagnostic system of claim 5, wherein the housing includes first and second mateable housing members, the first housing member including the diagnostic service connector, and the second housing member including the integrated vehicle bus connector.

13. The vehicle diagnostic system of claim 5, wherein the electronic communication module includes a microcontroller mounted on a printed circuit board enclosed within the housing.

14. The vehicle diagnostic system of claim 5, wherein the electronic communication module is mounted on a printed circuit board enclosed within the housing, wherein the diagnostic service connector includes a first plurality of terminals extending from the printed circuit board, and the integrated vehicle bus connector includes a second plurality of terminals extending from the printed circuit board.

15. The vehicle diagnostic system of claim 14, wherein the first plurality of terminals extend from the printed circuit board in a first direction, and the second plurality of terminals extend from the printed circuit board in a second direction that is substantially opposite the first direction.

* * * * *